United States Patent
Sukkau et al.

(10) Patent No.: US 12,120,859 B2
(45) Date of Patent: Oct. 15, 2024

(54) CURTAIN AND SHIELDED CHAMBER FOR SHIELDING AN ELECTROMAGNETIC FIELD

(71) Applicant: Siemens Healthineers AG, Forchheim (DE)

(72) Inventors: Johann Sukkau, Herzogenaurach (DE); Michael Wullenweber, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 18/090,846

(22) Filed: Dec. 29, 2022

(65) Prior Publication Data
US 2023/0209791 A1  Jun. 29, 2023

(30) Foreign Application Priority Data
Dec. 29, 2021 (EP) .................... 21218036

(51) Int. Cl.
*H05K 9/00* (2006.01)

(52) U.S. Cl.
CPC ......... *H05K 9/0052* (2013.01); *H05K 9/0003* (2013.01); *H05K 9/0069* (2013.01)

(58) Field of Classification Search
CPC .................................. H05K 9/0003
See application file for complete search history.

(56) References Cited

U.S. PATENT DOCUMENTS

| | | | | |
|---|---|---|---|---|
| 5,097,885 A * | 3/1992 | Kitagawa | ............... | E06B 9/24 160/84.01 |
| 8,735,742 B2 * | 5/2014 | Chen | ............... | H05K 9/0041 174/382 |
| 9,208,362 B1 * | 12/2015 | Fink | ............... | G06K 7/10336 |
| 10,867,592 B2 * | 12/2020 | Alba Fernandez | ..... | B32B 5/022 |
| 2005/0049491 A1 | 3/2005 | Rezzonico et al. | | |
| 2015/0206609 A1 * | 7/2015 | Lemer | ............... | A61B 50/13 250/515.1 |
| 2015/0253401 A1 * | 9/2015 | Rapoport | ............... | G01R 33/48 324/318 |
| 2017/0198422 A1 * | 7/2017 | Ishikawa | ............... | E04B 2/72 |
| 2019/0129059 A1 * | 5/2019 | Connelly | ............... | G21F 3/00 |
| 2023/0248157 A1 * | 8/2023 | Schwarzhans | ....... | A47C 31/004 174/378 |

FOREIGN PATENT DOCUMENTS

| | | |
|---|---|---|
| DE | 102014206522 A1 | 10/2015 |
| JP | H02203840 A | 8/1990 |
| JP | 2013000420 A | 1/2013 |
| JP | 2016112344 A | 6/2016 |

OTHER PUBLICATIONS https://aaronia.com/shielding-materials/; Dated: Jan. 8, 2021.

* cited by examiner

*Primary Examiner* — Hung V Ngo
(74) *Attorney, Agent, or Firm* — Banner & Witcoff Ltd.

(57) ABSTRACT

A curtain for shielding an electromagnetic field may include a plurality of strip elements. A first strip element and a second strip element of the plurality of strip elements may have an electrically conductive layer. In a shielding configuration of the curtain, the electrically conductive layer of the first strip element is electrically connected to the electrically conductive layer of the second strip element and/or to an electrical connecting terminal for a reference potential. The plurality of strip elements can be variably positioned against one another.

18 Claims, 4 Drawing Sheets

CURTAIN AND SHIELDED CHAMBER FOR SHIELDING AN ELECTROMAGNETIC FIELD

CROSS REFERENCE TO RELATED APPLICATIONS

This patent application claims priority to European Patent Application No. 21218036.8, filed Dec. 29, 2021, which is incorporated herein by reference in its entirety.

BACKGROUND

Magnetic resonance tomography is a known imaging technique that can be used to produce magnetic resonance images of an interior of the object under examination. When magnetic resonance imaging is being performed, the object under examination is usually positioned in a strong, static and homogeneous main magnetic field (B0 magnetic field) of a magnetic resonance apparatus. The main magnetic field can have magnetic field strengths of 0.2 Tesla to 7 Tesla, with the result that nuclear spins of the object under examination are oriented along the main magnetic field. In order to trigger nuclear spin resonances, as they are known, the object under examination is exposed to radiofrequency signals, known as excitation pulses (B1 magnetic field). Each excitation pulse causes deviation of the magnetization of certain nuclear spins of the object under examination from the main magnetic field by an amount also known as the flip angle. An excitation pulse can have an alternating magnetic field of frequency equal to the Larmor frequency for the given static magnetic field strength. The excited nuclear spins can have a rotating and decaying magnetization (nuclear spin resonance) that can be detected as a magnetic resonance signal by means of special antennas. Gradient magnetic fields can be superimposed on the main magnetic field for the purpose of spatial encoding of the nuclear spin resonances of the object under examination.

The received magnetic resonance signals are typically digitized and stored as complex values in a k-space matrix. This k-space matrix can be used as the basis for reconstructing magnetic resonance images and for determining spectroscopic data. The magnetic resonance image is typically reconstructed using a multi-dimensional Fourier transform of the k-space matrix.

To comply with legal requirements and also to ensure as high an image quality as possible, examination rooms of magnetic resonance systems are usually equipped with shielding (e.g. a Faraday cage). This shielding protects the magnetic resonance system as well as immediate surroundings of the examination room from electromagnetic fields. A possible implementation comprises cladding walls, ceilings and floors of the examination room with stainless-steel sheets. Entrances to the examination room, for instance doors, are either clad over the entire surface with stainless-steel sheet or provided with stainless-steel grilles and glass elements (if transparency is wanted). If the door to the examination room is open, the shielding is ineffective, and electromagnetic radiation can pass through the entrance to the examination room in both directions. In this case, it is usually prohibited to perform a magnetic resonance measurement because electromagnetic fields from the surroundings of the examination room can have a negative impact on the quality of acquired image data. Equally, equipment in the surroundings of the examination room can be affected by electromagnetic fields being emitted by the magnetic resonance apparatus.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
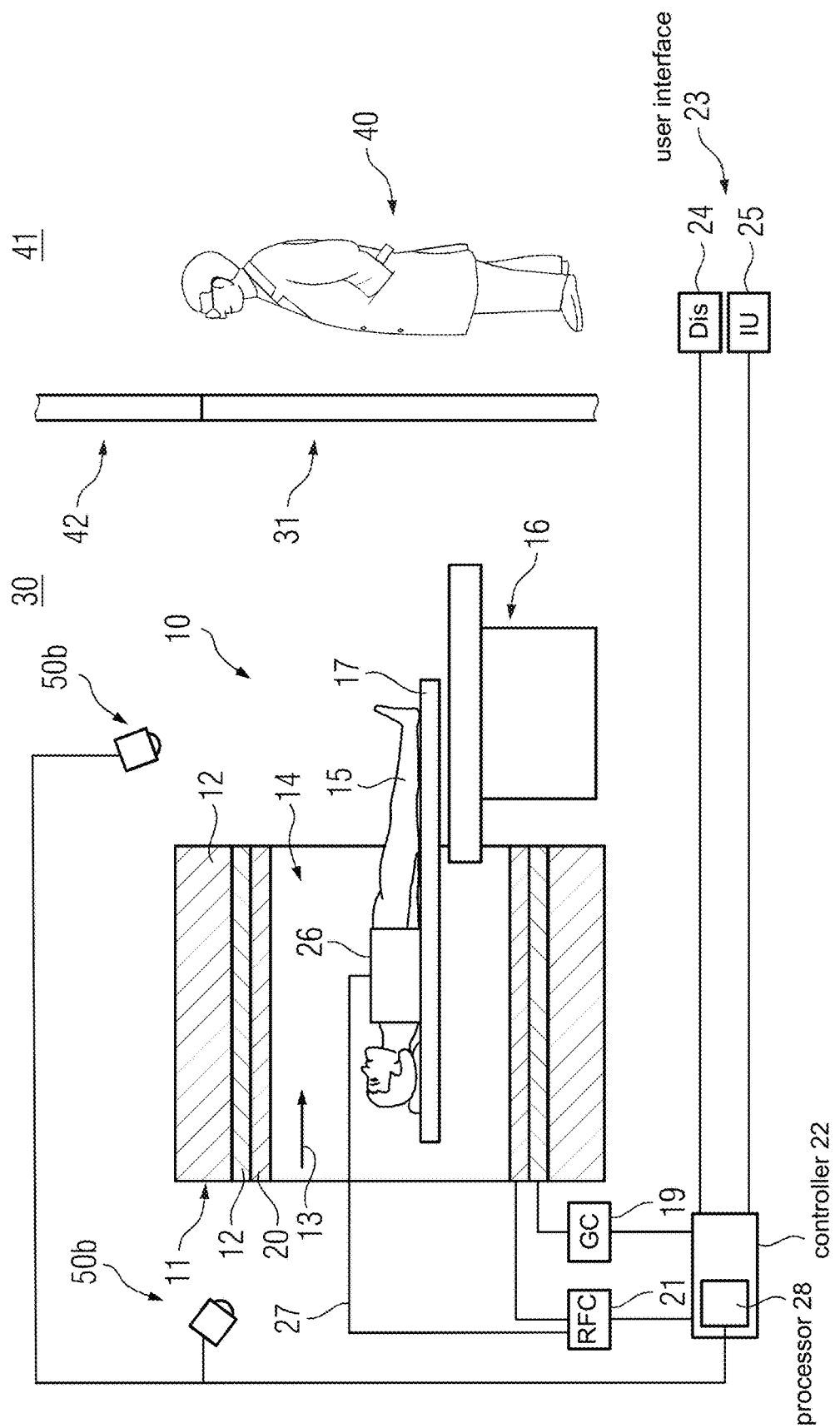
FIG. 1 is a schematic diagram of a magnetic resonance system having a shielded chamber according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

There is an interest in being able to perform work processes and/or selected magnetic resonance measurements even when a door to the examination room is open. This would make communication between a patient and a user of the magnetic resonance system easier, and also make it easier to prepare the magnetic resonance system and the patient for the performance of a magnetic resonance measurement.

Therefore, an object of the disclosure is to make a work process of a user of a magnetic resonance system more efficient and/or easier.

The curtain according to the disclosure for shielding an electromagnetic field has a plurality of strip elements. The curtain may be positioned at an entrance or entry to an examination room. The curtain can be positioned in particular at a door, a wall cutout or an aperture of a shielded chamber of a magnetic resonance system.

In an exemplary embodiment, the curtain is positioned such that, in a shielding configuration, the plurality of strip elements close or cover the aperture of the shielded chamber or the entry to the examination room substantially in full.

The shielding configuration can be characterized in particular in that individual strip elements of the plurality of strip elements are arranged next to one another in a substantially vertical orientation.

A first strip element and a second strip element have an electrically conductive layer. The electrically conductive layer is in particular flexible or comprises a flexible material. The electrically conductive layer can be designed to be flexible in such a way that the first strip element and/or the second strip element can be shifted from the shielding configuration into a pass-through configuration under the manual action of a user. A pass-through configuration can be characterized by an aperture of any shape that results from displacement, deflection and/or relative positioning of individual or multiple strip elements of the plurality of strip elements. The aperture that is in the pass-through configuration in particular can allow the user to pass through from the examination room into an adjoining room, or vice versa. In particular, the electrically conductive layer may be in the form of a thin foil, a thin wire and/or a wire mesh made of a conductive material. In particular, an electrically conductive material can constitute metal or carbon.

In one embodiment, the electrically conductive layer is in the form of a coating, a foil, a wire, a wire mesh, an arrangement of metal links and/or a carbon matrix. A mass or a volume of the electrically conductive layer can advantageously be reduced or optimized by providing a wire or a wire mesh. This can advantageously reduce effort by the user to shift the plurality of strip elements from the shielding configuration into the pass-through configuration.

An arrangement of metal links in particular can be in the form of a matrix or concatenation of chain links. In this case, the electrically conductive layer can be constituted by a solid material of the chain links or metal links.

A carbon matrix can likewise also advantageously reduce or optimize the weight and/or volume of the electrically conductive layer. A carbon matrix also has the advantage that a direction of a current flow can be adjusted by designing the carbon matrix as required. For example, the carbon matrix can have a plurality of carbon fibers, with at least a first portion of carbon fibers oriented substantially orthogonal, or at an angle, to a second portion of carbon fibers. A current flow along the carbon fibers can thereby be provided in at least two or more predetermined spatial directions.

In addition, the electrically conductive layer can also be in the form of a coating and/or an embedded foil. Costs and/or effort involved in producing the curtain can be reduced advantageously by using a foil and/or a coating.

In a shielding configuration of the curtain, the electrically conductive layer of the first strip element is electrically connected to the electrically conductive layer of the second strip element and/or to an electrical connecting terminal for a reference potential. An electrical connection can constitute in particular an electrically conducting connection. The plurality of strip elements may be electrically interconnected. The plurality of strip elements can be electrically interconnected in such a way as to allow a current flow along a direction of a main extension as well as at an angle to the main extension direction of the plurality of strip elements.

A main extension direction of the strip elements can correspond to a direction in which a strip element has the largest dimension, for example. In an exemplary embodiment, the plurality of strip elements are arranged in a vertical orientation at the entrance to the examination room. The largest dimension of a strip element can thus substantially correspond to a height of the aperture or of the door of the shielded chamber.

The first strip element and the second strip element can be electrically interconnected by means of a contact element, for example. It is equally conceivable, however, that the first strip element and the second strip element are connected mechanically by a retaining element. The first strip element and the second strip element can accordingly be electrically interconnected and/or connected to a reference potential via the retaining element.

It is also conceivable that one or more strip elements of the plurality of strip elements are connected to a connecting terminal for a reference potential in an electrically conducting manner. By virtue of an electrical conducting connection to a connecting terminal for a reference potential, the plurality of strip elements are able to conduct away an electrical potential or a current induced by an electromagnetic field.

The plurality of strip elements can be variably positioned against one another. It is conceivable that the first strip element and the second strip element can be disconnected mechanically and electrically from each other. For example, the first strip element and the second strip element can be separated from each other at least briefly during the shift of the curtain from the shielding configuration into the pass-through configuration in order to allow a user to pass through. It is also conceivable that a shielding effect of the curtain against electromagnetic fields is reduced while an arrangement of the plurality of strip elements deviates from the shielding configuration.

The first strip element and the second strip element can be mechanically unconnected. Being mechanically unconnected can mean in particular that the first strip element has electrical contact with the second strip element but is not connected to the second strip element in force-fit, form-fit and/or materially bonded manner. In particular, the first strip element and the second strip element can abut and/or touch each other without substantially restricting each other in a relative movement.

The curtain can be in the form of a single piece, for example. This can mean that the plurality of strip elements are interwoven with the curtain or are in the form of incisions in the curtain. Alternatively, the curtain can also have a retaining element that is mechanically connected to the plurality of strip elements.

A strip element can be characterized by a flat, elongated structure. Examples of suitable structures are bands, straps, strips and such like. A length dimension (e.g. a length along the main extension direction) of a strip element can exceed a width dimension of the strip element by, for example, a factor of between 1.2 and 50 or more. The plurality of strip elements may be arranged in an entrance region to an examination room, in particular in a wall cutout for a door. The length dimension of a strip element may equal a height of the wall cutout. The width dimension of a strip element can equal substantially a quotient of a width of the wall cutout and a total number of the plurality of strip elements. Of course, individual strip elements can also partially overlap laterally, and therefore the width dimension of a strip element exceeds the value of the quotient of the width of the wall cutout and the total number of strip elements. A width of a first subset of strip elements can correspond to a width of a second subset of strip elements, or can differ therefrom.

A shielding effect of the curtain according to the disclosure can be provided mainly by reflection of electromagnetic radiation at the electrically conductive layer. The electrically conductive layer of the curtain can have mobile charge carriers for this purpose, which interact with electromagnetic fields of the radiation. A high electrical conductivity and an electrically conducting connection to a connecting terminal for a reference potential can be advantageous here but should not be deemed absolutely essential. The shielding effect can also be provided by absorption. For example, electrical and/or magnetic dipoles in or on the electrically conductive layer can interact with, or attenuate, electromagnetic fields of the electromagnetic radiation. It is equally conceivable that the shielding effect is provided by reflection of the electromagnetic radiation at a plurality of boundary layers, for instance boundary layers of a multilayer carbon matrix. As a result of the skin effect, materials having a plurality of boundary layers can increase an effectiveness of the shielding effect significantly compared with single-layer or bulk materials.

The provision of a curtain according to the disclosure allows a user of a magnetic resonance system to alternate efficiently between the examination room and an adjoining room without overly compromising shielding of the examination room. A curtain according to the disclosure can also have lower sound attenuation than conventional doors. This can advantageously improve or make easier, communication between a first person outside the examination room and a second person inside the examination room. The curtain according to the disclosure can hence facilitate better and/or easier interaction of the first person with the second person.

In an embodiment of the curtain according to the disclosure, the electrically conductive layer has a protective layer, which at least partially encloses the electrically conductive layer, wherein the protective layer is designed
  to provide protection against touching the electrically conductive layer, and/or
  to protect the electrically conductive layer from an external influence.

A protective layer can have, in particular, electrically insulating properties. For example, the protective layer can consist of a material that has a low electrical conductivity. It is equally conceivable, however, that the protective layer has a low thermal conductivity.

The protective layer can enclose the electrically conductive layer at least partially or fully along the main extension direction of the plurality of strip elements. The electrically conductive layer can be at least partially enclosed by the protective layer and/or embedded therein. In particular, the protective layer can be in the form of a sheath or a coating.

It is conceivable that the protective layer is designed to prevent direct contact of the electrically conductive layer and a skin surface of the user. This can reduce a likelihood of fatty acids on the skin surface of the user being transferred to the electrically conductive layer, which can lead to corrosion of the electrically conductive layer. Contact with the user can thus constitute an external influence. It is equally conceivable, however, that an external influence comprises contact with moisture, dirt, dust and/or a mechanical stress. A mechanical stress can be characterized in particular by a mechanical interaction of the user with the curtain. Said mechanical interaction can occur, for example, when the curtain is shifted from the shielding configuration into the pass-through configuration, and vice versa.

The protective layer may be made of a flexible material in order to facilitate the shift of the curtain from the shielding configuration into the pass-through configuration. Examples of flexible materials having suitable properties are plastics such as polythene, polyamide, polyester and polyurethane, for example. In addition to plastics, natural-based materials, for instance cotton or hemp fibers, and various composite materials are also conceivable.

In an exemplary embodiment, the protective layer has a slot or a gap that allows electrical contact of the electrically conductive layer of the first strip element with the electrically conductive layer of the second strip element. Said contact can be provided, for example, by means of a contact element that breaches the protective layer.

An operating life of the plurality of strip elements can advantageously be extended by providing a protective layer. In addition, unwanted external influences on the electrically conductive layer by the user and/or the environment can be reduced or avoided advantageously by means of the protective layer.

In a further embodiment of the curtain according to the disclosure, the plurality of strip elements and/or the protective layer have a flexible material, which is designed to be reversibly deformed during relative positioning of the first strip element with respect to the second strip element.

The protective layer can comprise one of the aforementioned materials, for example. The protective layer may be configured such that the curtain returns by itself from the pass-through configuration into the shielding configuration according to the Earth's gravitational force. For example, the protective layer can be designed to be flexible in such a way that the first strip element returns according to the Earth's gravitational force to an initial configuration, which is characterized by a substantially planar extent of the first strip element and/or a substantially parallel orientation with respect to the second strip element and/or to a further strip element. It is equally conceivable, however, that the material of the protective layer has a shape memory. For example, the shape memory can be designed such that the plurality of strip elements endeavor to return to the shielding configuration.

The plurality of strip elements can have metal links, for example, which can be positioned relative to one another and hence allow reversible deformation. It is equally conceivable, however, that the plurality of strip elements have thin wires or fibers of metal or carbon, which can be reversibly deformed. Said thin wires or fibers can be arranged in particular in a fabric, a mesh or else a matrix.

It is also conceivable that the first strip element and/or the second strip element have a weight or ballast on a side that faces a floor of the examination room. The weight can be designed in particular to strengthen an effect of the Earth's gravitational force on the first strip element and/or the second strip element or to exert a force oriented in the direction of the Earth's gravitational pull on the first strip element and/or the second strip element.

Providing a curtain having a plurality of flexible strip elements can advantageously make it easier for the user to enter the examination room and/or to leave the examination room.

In an exemplary embodiment of the curtain according to the disclosure, the electrically conductive layer of the first strip element is electrically connected by means of a contact element to the electrically conductive layer of the second strip element and/or to the connecting terminal for the reference potential.

A contact element may include a material of high electrical conductivity. For example, the contact element can be made of copper, aluminum, silver or gold. It is equally conceivable that the contact element has a material of high electrical conductivity and/or is coated by said material.

The contact element can be configured to interconnect the first strip element and the second strip element electrically along the main extension direction of the first strip element and of the second strip element continuously or at discrete intervals. In particular, electrical cross-linkage of the curtain can be provided by means of the electrical connection of the first strip element to the second strip element. It is conceivable that the electrical cross-linkage of the curtain allows conduction of an electric current in a direction oriented at an angle to the main extension direction of the first strip element. Said angle can equal between 30 and 160°, for example. It is equally conceivable, however, that the angle is less than 30° and/or greater than 160°.

In an embodiment, the contact element is mechanically connected to the electrically conductive layer. The mechanical connection between the contact element and the electrically conductive layer can be in the form of a force-fit, form-fit and/or materially-bonded connection. The contact element can be connected to the electrically conductive layer of a strip element in particular by soldering, clamping and/or screw-fastening.

In an alternative embodiment, the contact element forms a part or segment of the electrically conductive layer. In particular, the contact element can protrude out of the protective layer of a strip element so as to facilitate electrical contact with a contact element of a further strip element.

The first strip element may have a first contact element. The second strip element can correspondingly have a second contact element. It is conceivable that the first contact element and the second contact element touch each other in a shielding configuration of the curtain and/or are electrically connected to each other. The electrical contact between the first contact element and the second contact element can be broken by the curtain shifting from the shielding configuration into the pass-through configuration. Equally, the electrical contact between the first contact element and the second contact element can be restored by the curtain returning to the shielding configuration.

In an embodiment, the contact element is in the form of a comb, a brush, a mesh and/or a fabric. In particular, the first contact element can have a plurality of electrical conductors, which have electrical contact with a plurality of electrical conductors of the second contact element when the curtain is in the shielding configuration. It is also conceivable that the plurality of electrical conductors of the first contact element at least partially engage mechanically with the plurality of electrical conductors of the second contact element when the curtain is in the shielding configuration. For example, the electrical conductors can be wires, braids, plates and/or tines. The electrical conductors can be arranged in a substantially two-dimensional manner along the main extension direction of the first strip element and of the second strip element. The electrical conductors may also be in the form of a fabric and/or a mesh, however.

In an embodiment, the electrically conductive layer is a carbon fabric, and the contact element is a part or segment of the carbon fabric. In this case, the contact element can constitute in particular a segment of the carbon fabric, which segment is brought out through a protective layer of a strip element.

In addition, the contact element can be in the form of an edge of an electrically conductive foil or of the electrically conductive layer. The contact element can constitute in particular a segment of the electrically conductive layer, which segment is brought out from a protective layer of a strip element. The edge of the electrically conductive foil or of the electrically conductive layer can have a substantially straight outline, which provides an approximately continuous electrical contact with contact elements of neighboring strip elements and/or with the connecting terminal for the reference potential.

It is equally conceivable that the electrical conductors are arranged in multiple layers or such that they overlap. In this case, the contact element can correspond substantially to a brush.

In an embodiment, the contact element has a coating which is configured to reduce or prevent chemical or mechanical stress to the contact element according to an external influence. In particular, the coating can have a high chemical and/or mechanical resistance in order to reduce or avoid corrosion and/or mechanical wear. Possible examples are metallic coatings of gold, chromium, and also ceramic coatings (e.g. mixed with metal particles) that have a sufficient electrical conductivity.

An electrical contact between the electrically conductive layer of the first strip element and the electrically conductive layer of the second strip element can be realized particularly easily by providing a contact element. In addition, the electrical contact between the electrically conductive layer of the first strip element and of the second strip element by means of the contact element can advantageously be made reversibly releasable, allowing a repeated alternation between shielding configuration and pass-through configuration.

In an embodiment, the curtain according to the disclosure comprises a retaining element that is mechanically connected to the first strip element and to the second strip element, and is configured to retain the first strip element and the second strip element in the shielding configuration at an aperture to an examination room.

The first strip element and the second strip element can be mechanically connected to the retaining element in any way. In an exemplary embodiment, the retaining element has a reference potential and/or is electrically connected to a reference potential. The mechanical connection between the retaining element and the first strip element or the second strip element can further comprise an electrically conductive connection. It is conceivable that the mechanical connection between the retaining element and the first strip element or the second strip element is embodied as a form-fit, force-fit and/or materially-bonded connection.

The aperture of the examination room can be in the form of an embodiment described below. In an exemplary embodiment, the plurality of strip elements fully cover an area defined by the aperture of the examination room.

In an embodiment of the curtain according to the disclosure, the retaining element is oriented substantially horizontally and has a curved shape. The retaining element may be oriented substantially horizontally or parallel to a floor and/or a ceiling of the examination room. As a result, the plurality of strip elements can have substantially identical length dimensions. It is equally conceivable that the substantially horizontal orientation of the retaining element provides the plurality of strip elements with uniform contact with a floor of the examination room and/or with a floor bar over an entire width of the entrance to the examination room.

A curved shape of the retaining element can be characterized by, for example, an arc shape, a funnel shape, an hourglass shape or such like. It is equally conceivable that the curved shape of the retaining element is characterized by a function having one or more inflection points.

In the shielding configuration, the curtain has a curved cross-sectional profile. It is conceivable that the curved shape of the retaining element influences or specifies the cross-sectional profile of the curtain. For example, the cross-sectional profile of the curtain along a sectional plane oriented substantially horizontally or parallel to the floor and/or the ceiling of the examination room can correspond to a cross-sectional shape of the retaining element. The retaining element may be shaped so as to extend a contact surface of at least two adjoining strip elements along the main extension direction. It is conceivable in particular that the first strip element and the second strip element are arranged at an angle to each other by the mechanical connection to the retaining element. This can mean that horizontal cross-sectional segments of the first strip element and of the second strip element are arranged non-parallel to each other. The overlapping surface can have one or more contact elements according to an above-described embodiment, or be in the form of such a contact element.

An overlapping surface and thus an electrical contact surface between strip elements of the curtain can be enlarged advantageously by providing a retaining element having a curved shape. In particular, as a result of the curved shape of the retaining element, shifting the curtain from the shielding configuration into the pass-through configuration can advantageously be made easier compared with a parallel arrangement of the plurality of strip elements.

In a further embodiment, the curtain according to the disclosure has electrical contact to the reference potential. It is conceivable that the retaining element and/or a frame element of the curtain are electrically connected to the reference potential. A frame element can be in the form of an electrical conductor and/or a contact element, for example, which, when the curtain is in the shielding configuration, is electrically connected to a strip element, in particular an outermost strip element, of the plurality of strip elements. For example, the frame element can be arranged on a vertical edge of the wall cutout of the entrance. It is equally conceivable, however, that the frame element is arranged on a horizontal edge and/or a horizontal segment of the entrance or wall cutout. The frame element can also be in the form of a floor bar, which is configured to provide, close to the floor, electrical contact to the plurality of strip elements. It is also conceivable that the frame element borders at least part of the aperture of the shielded chamber along an inner edge of the aperture.

The curtain is configured to counteract an effect of the electromagnetic field by facilitating an equalizing current to the reference potential. For example, the electrically conductive layer of the plurality of strip elements can be configured to facilitate the occurrence of eddy currents according to an effect of a first electromagnetic field. These eddy currents can generate a second electromagnetic field that is in opposition to the effect of the first electromagnetic field. The effects of the first electromagnetic field and the second electromagnetic field can cancel each other out at least locally, thereby providing a shielding effect. The electrically conductive layer is designed in particular to conduct away occurring or induced electric currents and/or potentials by means of electrical contact to the retaining element, the frame element and/or the floor bar.

In a further embodiment of the curtain according to the disclosure, the first strip element is electrically connected to a frame element and/or to a floor bar, wherein the frame element and/or the floor bar are electrically connected to the reference potential, and wherein the curtain is configured to conduct away an electric current to the frame element and/or the floor bar. It is equally conceivable that, in addition to, or instead of, the first strip element, it is the case that the second strip element and/or a further strip element is electrically connected to a frame element and/or a floor bar.

By providing electrical contact between the electrically conductive layer of the strip elements and the frame element or the floor bar, an electric current can be conducted away advantageously to a closest structure having a reference potential. It is thereby advantageously possible to avoid electrical potentials arising or being retained in the electrically conductive layer. In addition, any passage of electromagnetic fields can be advantageously avoided by providing electrical contact of the electrically conductive layer of the plurality of strip elements to the retaining element, the frame element and/or the floor bar.

The shielded chamber according to the disclosure for a magnetic resonance apparatus has an aperture and a curtain for shielding an electromagnetic field. A geometry of the shielded chamber can substantially correspond to a geometry of the examination room. It is conceivable in particular that the shielded chamber is defined by an internal surface of the examination room or is determined thereby. The aperture of the shielded chamber can constitute, for example, the entrance or entry to the examination room.

The curtain comprises a plurality of strip elements, wherein a first strip element and a second strip element of the plurality of strip elements have an electrically conductive layer, and wherein, in a shielding configuration of the curtain, the electrically conductive layer of the first strip element is electrically connected to an electrically conductive layer of the second strip element of the plurality of strip elements and/or to a reference potential. The plurality of strip elements can be variably positioned against one another along a main extension direction, wherein the curtain is arranged at the aperture of the shielded chamber, and is configured to allow access to the shielded chamber.

It is conceivable that the curtain according to an embodiment described above can be shifted manually by a user from the shielding configuration into the pass-through configuration. The user can thereby alternate between the examination room and an adjoining room efficiently and/or with little effort. An adjoining room can constitute in particular a control room for the magnetic resonance apparatus.

The shielded chamber according to the disclosure shares the advantages of the curtain according to the disclosure according to an above-described embodiment.

In an exemplary embodiment, the shielded chamber has at least one sensor, which is configured to ascertain whether the curtain is in the shielding configuration correctly.

The at least one sensor can be based on any measurement principle. The measurement principle of the at least one sensor can be suitable in particular for ascertaining and/or quantifying a geometric arrangement of the plurality of strip elements and/or an electrical property of the electrically conductive layer of the plurality of strip elements. For example, the at least one sensor can be in the form of a 2D camera, a 3D camera, an infrared camera or the like, which is configured to capture image data of the curtain. The captured image data can subsequently be processed by a processor in order to ascertain and/or quantify a divergence of a present configuration of the curtain from the shielding configuration. In particular, a camera that is already being used for other work processes in the examination room and/or the control room can be employed for this purpose. This can advantageously reduce additional costs for the at least one sensor.

The at least one sensor is configured to output a signal containing information about whether the curtain is in the shielding configuration. The signal can comprise, for example, an indicator that the plurality of strip elements are in the shielding configuration, a relative arrangement of the plurality of strip elements, and/or an electrical property of the electrically conductive layer of the plurality of strip elements. The signal from the at least one sensor can constitute in particular a digital signal or an analog signal. Providing at least one sensor can advantageously avoid time-consuming checking of the curtain by the user.

In an embodiment, the at least one sensor is in the form of a resistance sensor, which is configured to ascertain a resistance, in particular a sheet resistance, of the electrically conductive layer of the plurality of strip elements.

It is conceivable that the shielded chamber according to the disclosure has a first resistance sensor, which is configured to ascertain the resistance of the electrically conductive layer of the plurality of strip elements along a predetermined reference path along the plurality of strip elements. The predetermined reference path can comprise, for example, an entire width of the aperture of the shielded chamber, from one frame element to an opposite frame element. It is equally conceivable that the predetermined reference path comprises an entire height of the aperture of the shielded chamber from the retaining element to the floor bar. The shielded chamber according to the disclosure can also have a second resistance sensor, a third resistance sensor, a fourth resistance sensor and/or a further resistance sensor, which are configured to ascertain the resistance of the electrically conductive layer along different reference paths.

In particular, the resistance sensor can comprise a measurement arrangement that is configured to ascertain a sheet resistance of the electrically conductive layer of the plurality of strip elements. For example, the measurement arrangement can be configured to perform a four-point measurement and/or a van der Pauw measurement. Of course, other measurement methods besides these for ascertaining an electrical property of the electrically conductive layer are also conceivable.

A resistance sensor can be used to determine advantageously on the basis of the electrical resistance of the electrically conductive layer whether the curtain is in the shielding configuration. Resistance sensors provide a particularly easy-to-implement and/or cost-effective way of monitoring the shielding configuration of the curtain.

In a further embodiment of the shielded chamber according to the disclosure, the at least one sensor is in the form of an optical sensor, which is configured to ascertain a deviation of the curtain from the shielding configuration.

The optical sensor can comprise a camera, as described above. In an exemplary embodiment, the optical sensor is in the form of a light barrier. For this purpose, the optical sensor can comprise an arrangement of mirrors and also a transmitter and a receiver. The transmitter may be configured to emit a focused light beam at a predetermined frequency and/or a predetermined intensity. The receiver can be designed accordingly to measure an intensity of an emitted light beam. The arrangement of mirrors can be configured to direct the light beam along a surface of the curtain from the transmitter to the receiver. For example, the light beam can be guided so close along the surface of the plurality of strip elements that a deviation of the curtain from the shielding configuration leads to attenuation or interruption of the light beam, which can be detected by the receiver. It is conceivable that a corresponding optical sensor is installed on both sides of the curtain in order to be able to detect with high accuracy a protrusion of a strip element from a substantially planar surface of the curtain and/or an entanglement or twisting of a strip element.

Using an optically-based measurement technique can advantageously avoid a mechanical connection of the at least one sensor to individual strip elements. This can advantageously increase a mobility of individual strip elements.

In an embodiment, the shielded chamber according to the disclosure has a ventilation system, which is configured to assist by means of an air flow a shift of the curtain from a pass-through configuration into the shielding configuration. It is conceivable that the ventilation system is configured to guide the air flow vertically approximately parallel to a surface of the plurality of strip elements. Providing the air flow can advantageously assist a parallel orientation of the plurality of strip elements. This can advantageously reduce or avoid a need for manual intervention or manual correction by the user.

The magnetic resonance system according to the disclosure having a magnetic resonance apparatus and a shielded chamber according to an above-described embodiment has a controller, wherein the controller has a signal connection to the at least one sensor, and is configured to enable, on the basis of the signal from the at least one sensor, a magnetic resonance measurement.

The controller and the at least one sensor can be connected to one another by means of a wired or wireless connection. The controller can have a processor, which is configured to process the signal from the at least one sensor. The processor and/or the controller are designed in particular to monitor on the basis of the signal from the at least one sensor whether a shielding configuration is present. It is equally conceivable that the processor and/or the controller are configured to determine on the basis of the signal from the at least one sensor a deviation from a shielding configuration.

By virtue of the facility to monitor the shielding configuration of the curtain, it is advantageously possible to prevent a magnetic resonance measurement from being performed when there is insufficient shielding of the examination room.

In an embodiment of the magnetic resonance system according to the disclosure, the shielded chamber also has a door, which is configured to provide, in a shielding position, shielding from an electromagnetic field. The door can constitute a conventional door of an examination room for a magnetic resonance system. The door can be designed in particular to shield, in the shielding position, electromagnetic fields. It is conceivable that the curtain according to the disclosure is installed in addition to the conventional door in the aperture of the shielded chamber. This has the advantage that the door can remain open during preparation of a magnetic resonance measurement and/or while appropriate magnetic resonance measurements are being performed, in order to make it easier for the user to pass through. In addition, the door can be closed during sensitive magnetic resonance measurements in order to provide a shielding effect required for the magnetic resonance measurement.

The controller is configured to monitor the shielding position of the door. The door can have a limit switch for this purpose, for instance an electrical contact, an optical sensor or a comparable sensor, which indicates a closed state of the door by means of a predetermined signal.

The controller is also configured to enable, on the basis of a parameter of the magnetic resonance measurement and the signal from the at least one sensor, performance of the magnetic resonance measurement when the door deviates from the shielding position. The parameter of the magnetic resonance measurement comprises an indicator about an admissibility of performing the magnetic resonance measurement when the door deviates from the shielding position. The enabling of magnetic resonance measurements can be done selectively in particular. A parameter set or an imaging sequence of a magnetic resonance measurement can have a first parameter, for instance, which specifies an eligibility to perform the magnetic resonance measurement when the door is open and when the curtain is in the shielding configuration. For example, the first parameter can be a binary parameter (such a parameter can represent e.g. the value "0" or "1"). The first parameter can also depend, however, on further parameters of the parameter set or on a signal from the at least one sensor and/or limit switch. If, for example, the first parameter has the value "1", a magnetic resonance measurement is allowed to be performed when the door is open and the curtain is in the shielding configuration. If, on the other hand, the first parameter has the value "0", the door of the shielded chamber must be closed for the magnetic resonance measurement to be performed.

The controller can ascertain a shielding state of the shielded chamber by means of the signal connection to the at least one sensor and the limit switch of the door, and accordingly enable or prevent performance of a magnetic resonance measurement. For example, the controller can be configured to prevent a magnetic resonance measurement from starting if the magnetic resonance measurement is allowed to be performed with the door open, but the curtain deviates from the shielding configuration. In a further example, deviation of the curtain from the shielding configuration can be irrelevant to executing the magnetic resonance measurement if the door of the shielded chamber is closed. The controller is hence configured to enable performance of a magnetic resonance measurement according to whether the curtain is in the shielding configuration, according to a state of the door of the shielded chamber and/or according to a parameter set of the present magnetic resonance measurement.

By providing the magnetic resonance system according to the disclosure with the controller it is advantageously possible to avoid performing a magnetic resonance measurement when the shielded chamber is in an unwanted shielding state. In addition, work processes of a user of a magnetic resonance system can be made easier and/or more efficient by providing a controller according to the disclosure and a shielded chamber according to the disclosure. In particular, by providing a curtain according to the disclosure, performing what are known as localizer measurements and/or non-specific whole-body measurements (e.g. by means of Fast-View) can take place because of lower shielding requirements even with the door open and hence advantageously can be made easier. The magnetic resonance system according to the disclosure shares the advantages of the curtain according to the disclosure and of the shielded chamber according to the disclosure according to an above-described embodiment.

FIG. 1 shows schematically a possible embodiment of a magnetic resonance system according to the disclosure. The magnetic resonance system comprises a magnetic resonance apparatus 10 containing a magnet unit 11, which has, for example, a permanent magnet, an electromagnet or a superconducting main magnet 12 for generating a strong and in particular homogeneous main magnetic field 13 (B0 magnetic field). The magnetic resonance apparatus 10 also comprises a patient placement region 14 for accommodating a patient 15. In the present exemplary embodiment, the patient placement region 14 is shaped as a cylinder and is enclosed in a circumferential direction by the magnet unit 11. It is also conceivable, however, that the patient placement region 14 has a different design from this example. In the present case, the magnetic resonance apparatus 10 is positioned in a shielded chamber 42, only part of which is shown in the figure, and which encloses the magnetic resonance apparatus around the outside perimeter thereof.

The patient 15 can be positioned in the patient placement region 14 by a patient positioning apparatus 16 of the magnetic resonance apparatus 10. The patient positioning apparatus 16 comprises for this purpose a patient couch 17, which is configured to be able to move inside the patient placement region 14. The magnet unit 11 further comprises a gradient coil 18 for generating gradient magnetic fields, which are used for spatial encoding during a magnetic resonance measurement. The gradient coil 18 is controlled by a gradient controller 19 of the magnetic resonance apparatus 10. The magnet unit 11 can also comprise a radiofrequency antenna, which in the present exemplary embodiment is in the form of a body coil 20 that is fixedly integrated in the magnetic resonance apparatus 10. The body coil 20 is configured to excite atomic nuclei located in the main magnetic field 13 generated by the main magnet 12. The body coil 20 is controlled by a radiofrequency unit 21 of the magnetic resonance apparatus 10, and radiates radiofrequency signals into an examination space, which is largely formed by a patient placement zone 14 of the magnetic resonance apparatus 10. The body coil 20 can also be configured to receive magnetic resonance signals.

The magnetic resonance apparatus 10 comprises a controller 22 configured to control the main magnet 12, the gradient controller 19 and the radiofrequency controller 21. The controller 22 is configured to control a performance of a sequence, for instance an imaging gradient echo sequence, a TSE sequence or a UTE sequence. In addition, the controller 22 comprises a processor 28 for analyzing digitized magnetic resonance signals captured during a magnetic resonance measurement. In an exemplary embodiment, the controller 22 includes processing circuitry that is configured to perform one or more operations and/or functions of the controller 22.

In addition, the magnetic resonance apparatus 10 comprises a user interface 23, which has a signal connection to the controller 22. The user interface may be housed in a control room 41, which adjoins the examination room 30 or the shielded chamber 42 containing the magnetic resonance apparatus 10. Control data such as imaging parameters and reconstructed magnetic resonance images can be displayed to a user 40 on a display unit 24, for example on at least one monitor, of the user interface 23. In addition, the user interface 23 comprises an input unit 25, by means of which the user 40 can enter parameters for magnetic resonance imaging.

The magnetic resonance apparatus 10 also comprises a local coil 26, which in the present case is positioned on the upper body of the patient 15, and transmits magnetic resonance signals from a thorax volume to the magnetic resonance apparatus 10. The local coil 26 may have an electrical connecting line 27, which provides a signal connection to the radiofrequency unit 21 and to the controller 22. The local coil 26 can also be connected to the magnetic resonance apparatus 10 by means of a wireless signal connection, however. Just like the body coil 20, the local coil 26 can also be configured to excite atomic nuclei and to receive magnetic resonance signals.

In the example shown in FIG. 1, the magnetic resonance system also has two cameras 50a and 50b, which are configured to assist a work process of the magnetic resonance measurement. Possible examples of such assistance include positioning local coils 26 on the patient 15, positioning the patient 15 relative to the patient couch 17, as well as facial recognition of the patient 15 during a magnetic resonance measurement. At least one camera 50b can be directed towards an entrance to the examination room 30 and can capture image data of the curtain 31. It is conceivable that the image data from the camera 50b is transferred by means of a signal connection to the processor 28 of the controller 22. The processor 28 can accordingly be configured to process the image data in order to monitor a shielding configuration of the curtain 31. The processor 28 is designed in particular to enable selected magnetic resonance measurements if the curtain 31 is in a shielding configuration and/or to prevent execution of a magnetic resonance measurement if the present configuration of the curtain 31 deviates from the shielding configuration.

It is conceivable that selected magnetic resonance measurements have a parameter that indicates the possibility of executing magnetic resonance measurements when a door 32 is open (see FIG. 2) and when the curtain 31 is in the shielding configuration, or provides a corresponding code. The controller 22 can ascertain a shielding state of the shielded chamber 42 by means of the signal connection to the camera 50b or to another sensor 50, and accordingly enable or prevent performance of a magnetic resonance measurement. In this case, in particular also a shielding position of an additionally present door 32 is monitored (for instance by means of the camera 50b, an electrical contact and/or a limit switch), and considered in the enabling or performance of a magnetic resonance measurement.

The magnetic resonance system shown in FIG. 1 can obviously comprise further components typical of magnetic resonance systems. It is equally conceivable that the magnetic resonance apparatus 10 has, instead of the cylindrical design, a C-shaped, triangular or asymmetrical design of the magnetic-field generating components. The magnetic resonance apparatus 10 can be designed in particular as a dedicated scanner for examining specific body regions, for instance a head scanner, a dental scanner, a scanner for extremities, or the like. The following figures give an overview of possible designs of the curtain 31 according to the disclosure.

Figure 2:
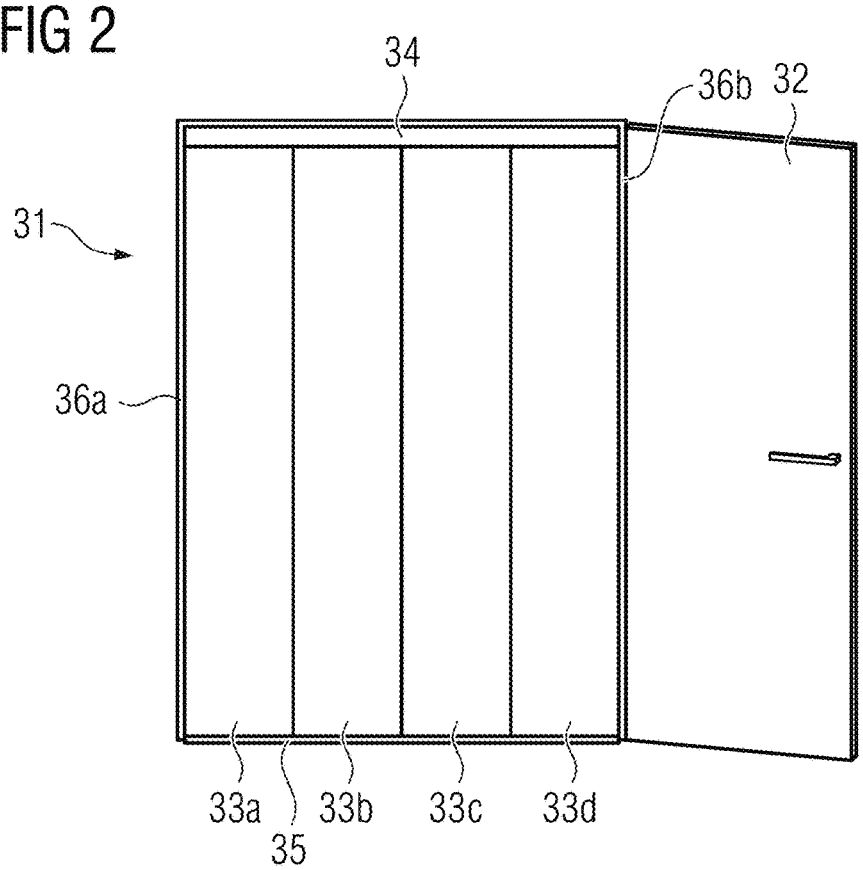
FIG. 2 is a schematic diagram of a curtain according to an exemplary embodiment of the disclosure.

FIG. 2 shows schematically an embodiment of a curtain 31 according to the disclosure. In the example shown, the curtain 31 is integrated in addition to a door 32 in an entrance region of the shielded chamber 42 or of the examination room 30. The curtain 31 in the present case has four strip elements 33a, 33b, 33c and 33d (33a-d). The strip elements 33a-d are mechanically connected to a retaining element 34 and are in the shielding configuration in the present case.

The strip elements 33a-d are oriented substantially parallel to one another and have electrical contact with the retaining element 34 and the floor bar 35. The two outer strip elements 33a and 33d also have electrical contact with the frame elements 36a and 36b. The electrical contact between the strip elements 33a-33d, but also of the floor bar and/or the frame element, can be realized, for example, by means of suitable contact elements (see FIGS. 5 and 6) and/or by overlapping (see FIG. 3). In an exemplary embodiment, the electrical contact of the strip elements 33a-d with the retaining element 34 is achieved by means of the mechanical connection. The retaining element 34, the frame elements 36a and 36b and/or the floor bar 35 can be electrically connected to a suitable reference potential. The retaining element 34 is designed in particular to retain the strip elements 33a-d in the shielding configuration. Since the strip elements 33a-d are mechanically unconnected, the user 40 is able to deflect the strip elements 33a-d independently of one another relative to the retaining element 34 and shift said strip elements into a pass-through configuration (not shown). The strip elements 33a-d can also be weighted with weights (not shown) in order to ensure a return to the shielding configuration.

Figure 3:
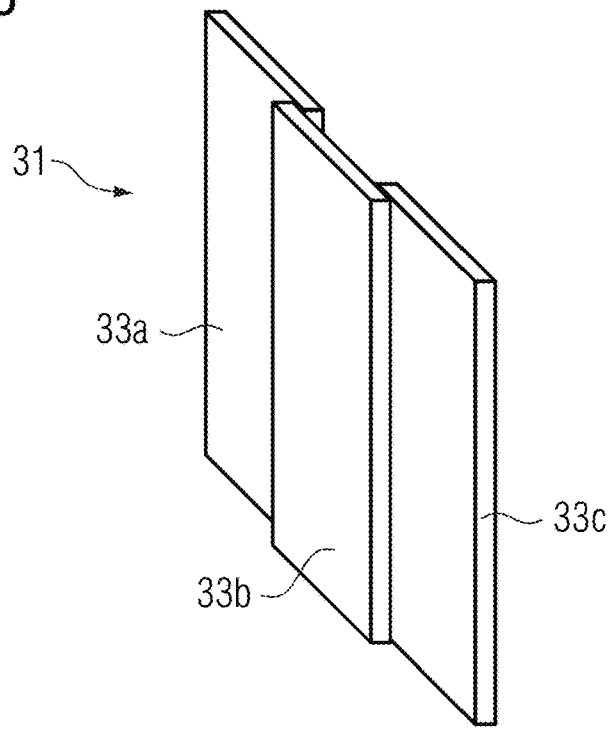
FIG. 3 is a schematic diagram of a curtain according to an exemplary embodiment of the disclosure.

FIG. 3 shows schematically a possible embodiment of the curtain 31 according to the disclosure. In the present example, the strip elements 33a-c of the curtain 31 are arranged to partially overlap. Overlapping the strip elements 33a-c provides a contact surface between the strip elements 33a-c that allows conduction of an electric current between the strip elements 33a-c, in particular also in a horizontal direction. The strip elements 33a-c can have a protective layer (see FIG. 4) that is electrically conductive and/or has a slot on the overlapping surfaces of the strip elements 33a-c. The strip elements 33a-c can also be made of a stainless-steel fabric, a stainless-steel mesh or of stainless-steel links, however, without any additional protective layer. It is equally conceivable that the strip elements 33a-c are arranged substantially next to one another instead of partially overlapping. It is also conceivable that the strip elements 33a-c are arranged to overlap one behind the other instead or to overlap in an alternating manner.

Figure 4:
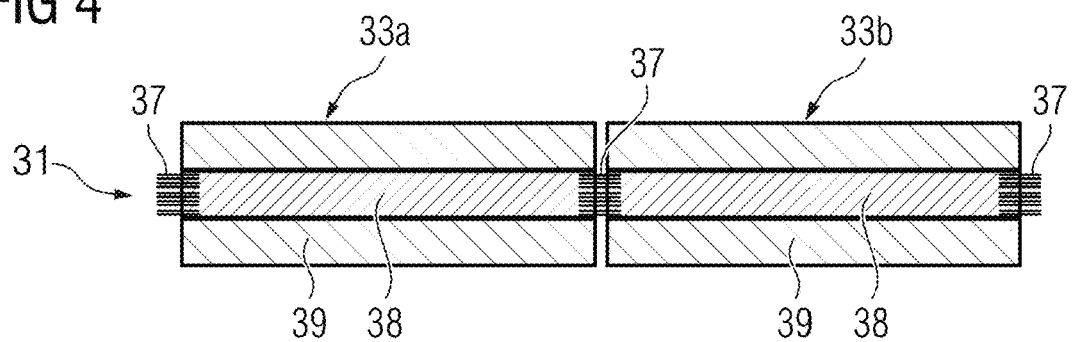
FIG. 4 is a schematic diagram of a curtain according to an exemplary embodiment of the disclosure.

FIG. 4 shows schematically a cross-sectional view of two strip elements 33a and 33b of the curtain 31 according to the disclosure. In the present example, the electrically conductive layer 38 of the strip elements 33a and 33b are enclosed by a flexible protective layer 39. The protective layer 39 of the strip element 33a has at a side that faces the strip element 33b an aperture or slot, which allows an electrical connection of the electrically conductive layers 38 of the strip elements 33a and 33b.

In the present diagram, the curtain 31 has a plurality of contact elements 37, which electrically connect the electrically conductive layers 38 of the strip elements 33a and 33b. The contact elements 37 are in the form of brushes by way of example. The outer strip elements 33a and 33d (see FIG. 2) may be electrically connected to the frame elements 36a and 36b and to the floor bar 35 by means of contact elements 37.

In alternative embodiments, contact elements 37 can also be omitted. In this case, the shielding effect of the curtain is achieved mainly by reflection and/or absorption.

Figure 5:
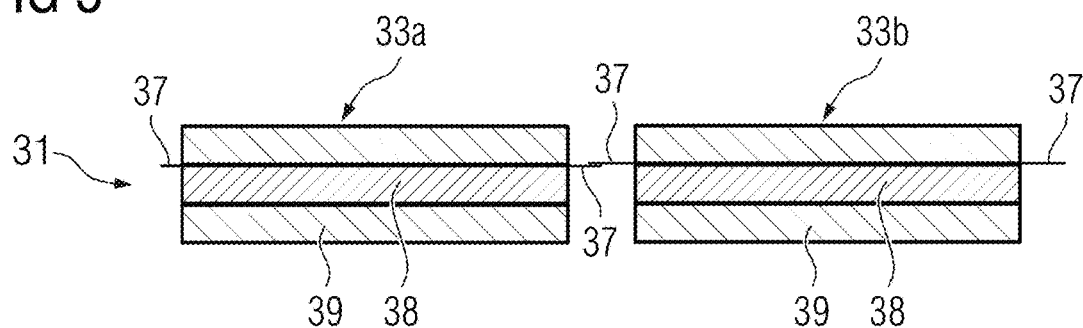
FIG. 5 is a schematic diagram of a curtain according to an exemplary embodiment of the disclosure.

FIG. 5 shows an alternative embodiment of the curtain 31 according to the disclosure. In contrast with FIG. 4, the contact elements 37 are in this case in the form of flat foils or fabric layers. The foils, sheets or fabric layers 37 can be arranged between the protective layer 39 and the electrically conductive layer 38, and can be electrically connected to the electrically conductive layer 38. In the shielding configuration, the contact elements 37 of the strip elements 33a and 33b may have an overlap region, which allows an electrical connection of the electrically conductive layers 38 of the strip elements 33a and 33b. Dimensions and relative sizes of the components shown are of course to be understood to be examples, and can vary significantly according to materials used and user preferences.

Figure 6:
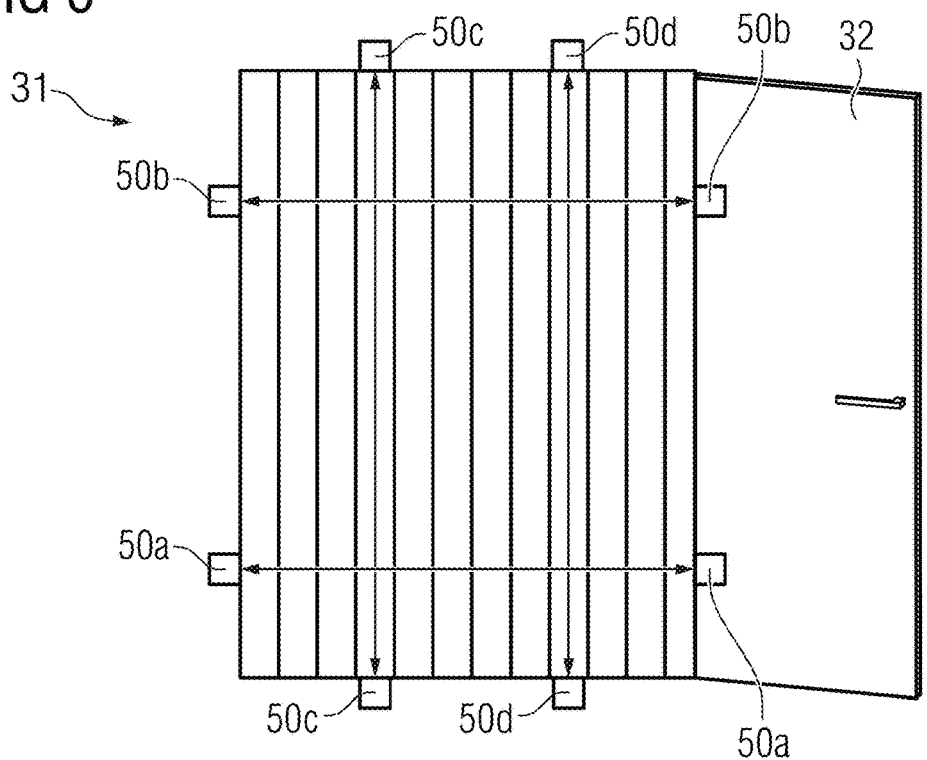
FIG. 6 is a schematic diagram of a curtain according to an exemplary embodiment of the disclosure.

FIG. 6 shows an embodiment in which the curtain 31 according to the disclosure has resistance sensors 50a, 50b, 50c and 50d (50a-d). Each of the resistance sensors 50a-d may have a source and a receiver, which may be arranged at opposite sides of the curtain 31. The sources may constitute in particular (constant) current sources, whereas the receivers are in the form of voltage sensors. It is conceivable that the curtain 31 has a smaller number of sources than receivers. In an embodiment, the curtain 31 has one source and one or more receivers.

In the embodiment shown in FIG. 6, the resistance sensors 50a-d are configured to ascertain the electrical resistance (or voltage drop) of the electrically conductive layer 38 of the curtain 31 along four reference paths (see arrows). In an exemplary embodiment, in the shielding configuration of the curtain 31, a reference measurement of the resistance (or of the voltage drop) is performed once or at regular intervals and used as a reference by the controller 22 of the magnetic resonance system. If currently measured resistances (or voltage drops) deviate from the reference, then a deviation of the curtain 31 from the shielding configuration can be ascertained, and execution of a magnetic resonance measurement can be prevented.

As an alternative to the variant shown in FIG. 6, the resistance measurement can also be implemented as a four-point measurement or a van der Pauw measurement. In this case, instead of individual resistances along reference paths, at least one sheet resistance of the electrically conductive layer 38 of the plurality of strip elements 33 is ascertained and used to determine a present configuration of the curtain 31.

Figure 7:
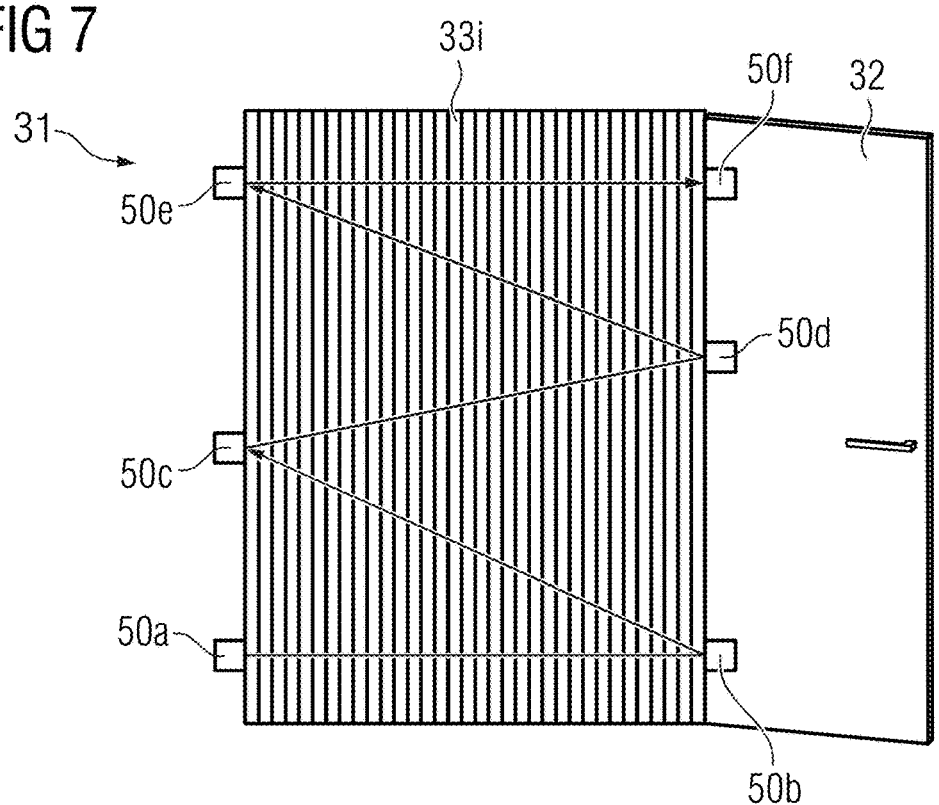
FIG. 7 is a schematic diagram of a curtain according to an exemplary embodiment of the disclosure.

FIG. 7 shows an embodiment of the curtain according to the disclosure, in which embodiment a light barrier 50 is used to ascertain the shielding configuration. The curtain 31 has for this purpose a transmitter 50a, which is configured to emit a focused light beam. The light beam is deflected multiple times by the mirrors 50b, 50c, 50d and 50e, and finally transmitted to a receiver 50f. The light beam may be guided directly along a surface of the plurality of strip elements 33, so that twisting, entanglement and/or protrusion of a strip element 33i from a substantially planar front surface of the plurality of strip elements 33 leads to attenuation or interruption of the light beam. A deviation of the curtain 31 from the shielding configuration can accordingly be detected on the basis of a signal from the receiver 50f. For example, the signal is determined here according to an intensity and/or an interruption of the light beam. The shielded chamber 42 according to the disclosure may have a first light barrier on the side facing the examination room 30 and a second light barrier on the side facing an adjoining room (e.g. control room 41). The light barrier 50 can have any number of mirror elements, and also a plurality of transmitters and receivers.

In the embodiments of FIGS. 1, 6 and 7, the sensor 50 may be connected to the controller 22 and/or the processor 28 by means of a wired or wireless signal connection. It is equally conceivable, however, that the sensor 50 already has a processor and/or controller for processing and/or conditioning the signal from the sensor 50 before it is transmitted by means of a suitable interface to the processor 28 and/or to the controller 22 of the magnetic resonance apparatus 10.

Figure 8:
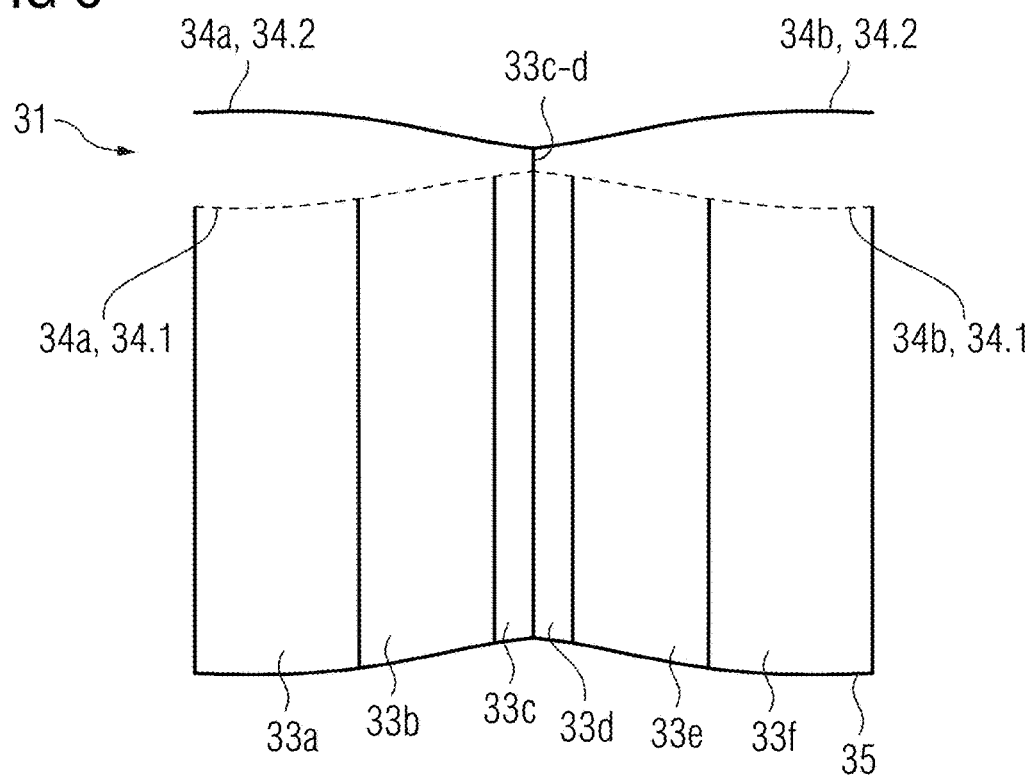
FIG. 8 is a schematic diagram of a curtain according to an exemplary embodiment of the disclosure.

In the embodiment shown in FIG. 8, the retaining element 34a has a curved shape. The retaining element 34a is here oriented substantially parallel to the floor and/or the ceiling (not shown) of the examination room 30. The curtain 31 in the present case has strip elements 33a, 33b, 33c, 33d, 33e and 33f (33a-f), which can have an identical or different width dimension. In particular, the curtain 31 has a contact region 33c-d, which is characterized by an overlap or abutting of the strip elements 33c and 33d. The contact region 33c-d may constitute a pass-through region for the user 40, who can manually deflect the strip elements 33a-c and the strip elements 33d-f in different directions when passing through.

The strip element can be in the form of a single piece or, as shown in FIG. 8, composed of a plurality of retaining elements 34a and 34b. In the example shown, the retaining elements 34a and 34b have a substantially funnel-shaped, U-shaped or V-shaped cross-section, and face each other across a parting point or a parting surface characterized by the contact region 33c-d. The retaining element 34, which is obtained from the retaining elements 34a and 34b, can thus have a cross-sectional shape reminiscent of an hourglass.

Alternatively, however, the retaining element 34 can also have two retaining elements 34.1 and 34.2. The cross-sectional shape of the retaining element 34.1 can correspond substantially to a cross-sectional profile of the curtain 31 along a sectional plane oriented substantially horizontally or parallel to the floor and/or the ceiling of the examination room 30 (dashed line). The retaining element 34.1 can be arranged, for example, on a side of the curtain 31 that faces the examination room 30, whereas the retaining element 34.2 can be arranged on the side that faces the control room 41.

Although the disclosure has been illustrated and described in detail using the exemplary embodiments, the disclosure is not limited by the disclosed examples, and a person skilled in the art can derive other variations therefrom that are still covered by the scope of protection of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A curtain for shielding an electromagnetic field, comprising:
a plurality of strip elements, including a first strip element and a second strip element, each of the first and second strip elements having an electrically conductive layer, the plurality of strip elements being configured to be variably positioned against one another, wherein:
the first strip element and the second strip element are configured to be disconnected mechanically and electrically from one another;
in a shielding configuration of the curtain, the electrically conductive layer of the first strip element is electrically connected to the electrically conductive layer of the second strip element and/or to an electrical connecting terminal having a reference potential; and
the first strip element and the second strip element are configured to provide an automatic return of the curtain into the shielding configuration.

2. The curtain as claimed in claim 1, wherein the respective electrically conductive layer is a coating, a foil, a wire, a wire mesh, an arrangement of metal links and/or a carbon matrix.

3. The curtain as claimed in claim 1, wherein the electrically conductive layer includes a protective layer that at least partially enclose the respective electrically conductive layer, the protective layer is configured to:
protect against contact of the electrically conductive layer, and/or
protect the respective electrically conductive layer from an external influence.

4. The curtain as claimed in claim 3, wherein the plurality of strip elements and/or the respective protective layers include a flexible material configured to be reversibly deformed during relative positioning of the first strip element with respect to the second strip element.

5. The curtain as claimed in claim 1, wherein the electrically conductive layer of the first strip element is electrically connected, by a contact element, to the electrically conductive layer of the second strip element and/or to the connecting terminal.

6. The curtain as claimed in claim 5, wherein the contact element is a comb, a brush, a mesh and/or a fabric.

7. The curtain as claimed in claim 1, further comprising:
a retainer that is mechanically connected to the first strip element and to the second strip element, the retainer being configured to retain the first strip element and the second strip element in the shielding configuration at an aperture to an examination room.

8. The curtain as claimed in claim 1, wherein the curtain is in electrical contact with the reference potential, and wherein the curtain is configured to facilitate an equalizing current to the reference potential to counteract an effect of the electromagnetic field.

9. The curtain as claimed in claim 1, wherein the first strip element is electrically connected to a frame element and/or to a floor bar, the frame element and/or the floor bar being electrically connected to the reference potential, and wherein the curtain is configured to conduct away an electric current to the frame element and/or the floor bar.

10. A shielded chamber for a magnetic resonance apparatus, comprising:
a curtain configured to shield an electromagnetic field, the curtain including a plurality of strip elements, wherein a first strip element and a second strip element of the plurality of strip elements each have an electrically conductive layer, the first strip element and the second strip element being configured to be disconnected mechanically and electrically from one another; and
an aperture configured to allow access to the shielded chamber, the curtain being arranged at the aperture, wherein:

in a shielding configuration of the curtain, the electrically conductive layer of the first strip element is electrically connected to the electrically conductive layer of the second strip element of the plurality of strip elements and/or to a reference potential;

the plurality of strip elements are configured to be variably positioned against one another along a main extension direction; and the plurality of strip elements are configured to provide an automatic return of the curtain into the shielding configuration.

11. The shielded chamber as claimed in claim 10, further comprising at least one sensor configured to determine whether the curtain is correctly in the shielding configuration and output a signal based on the determination.

12. The shielded chamber as claimed in claim 11, wherein the at least one sensor is a resistance sensor configured to determine a resistance of each of the electrically conductive layers of the plurality of strip elements.

13. The shielded chamber as claimed in claim 11, wherein the at least one sensor is an optical sensor configured to determine a deviation of the curtain from the shielding configuration.

14. A magnetic resonance system comprising:
a magnetic resonance apparatus; and
a shielded chamber including:
  a curtain configured to shield an electromagnetic field, the curtain including a plurality of strip elements, wherein a first strip element and a second strip element of the plurality of strip elements each have an electrically conductive layer;
  an aperture configured to allow access to the shielded chamber, the curtain being arranged at the aperture, wherein: in a shielding configuration of the curtain, the electrically conductive layer of the first strip element is electrically connected to the electrically conductive layer of the second strip element of the plurality of strip elements and/or to a reference potential, and the plurality of strip elements are configured to be variably positioned against one another along a main extension direction;
  a sensor configured to determine: whether the curtain is correctly in the shielding configuration, a resistance of each of the electrically conductive layers of the plurality of strip elements, and/or a deviation of the curtain from the shielding configuration; and
  a controller having a signal connection to the sensor, the controller being configured to control the magnetic resonance apparatus to perform a magnetic resonance measurement based on the determination by the sensor.

15. The magnetic resonance system as claimed in claim 14, wherein the shielded chamber further comprises a door configured to provide, in a shielding position, shielding from an electromagnetic field, the controller being configured to: monitor the shielding position of the door, and control the magnetic resonance apparatus to perform the magnetic resonance measurement based on the a parameter of the magnetic resonance measurement and the determination by the sensor, in response to the door deviating from the shielding position, wherein the parameter of the magnetic resonance measurement comprises an indicator about an admissibility of performing the magnetic resonance measurement when the door deviates from the shielding position.

16. A shielded chamber for a magnetic resonance apparatus, comprising:
a curtain configured to shield an electromagnetic field, the curtain including a plurality of strip elements, wherein a first strip element and a second strip element of the plurality of strip elements each have an electrically conductive layer;
at least one sensor configured to: determine whether the curtain is correctly in a shielding configuration, and output a signal based on the determination; and
an aperture configured to allow access to the shielded chamber, the curtain being arranged at the aperture, wherein:
  in the shielding configuration of the curtain, the electrically conductive layer of the first strip element is electrically connected to the electrically conductive layer of the second strip element of the plurality of strip elements and/or to a reference potential, and
  the plurality of strip elements are configured to be variably positioned against one another along a main extension direction.

17. The shielded chamber as claimed in claim 16, wherein the at least one sensor is a resistance sensor configured to determine a resistance of each of the electrically conductive layers of the plurality of strip elements.

18. The shielded chamber as claimed in claim 16, wherein the at least one sensor is an optical sensor configured to determine a deviation of the curtain from the shielding configuration.

* * * * *